United States Patent
Pu et al.

(10) Patent No.: US 8,400,178 B2
(45) Date of Patent: Mar. 19, 2013

(54) METHOD AND SYSTEM OF TESTING A SEMICONDUCTOR DEVICE

(75) Inventors: Han-Ping Pu, Taichung (TW); Mill-Jer Wang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 482 days.

(21) Appl. No.: 12/431,927

(22) Filed: Apr. 29, 2009

(65) Prior Publication Data

US 2010/0278211 A1    Nov. 4, 2010

(51) Int. Cl.
  *G01R 31/02* (2006.01)
(52) U.S. Cl. .................................. 324/762.01
(58) Field of Classification Search ......................... None
  See application file for complete search history.

(56) References Cited

U.S. PATENT DOCUMENTS

| | | | | |
|---|---|---|---|---|
| 5,233,161 A * | 8/1993 | Farwell et al. | ........... | 324/750.06 |
| 5,309,090 A | 5/1994 | Lipp | | |
| 5,911,897 A * | 6/1999 | Hamilton | ................. | 324/750.07 |
| 6,921,681 B2 * | 7/2005 | Sun et al. | ......................... | 438/69 |
| 7,091,585 B2 * | 8/2006 | Sun et al. | ........................ | 257/684 |
| 7,279,703 B2 | 10/2007 | Norris et al. | | |
| 7,316,761 B2 * | 1/2008 | Doan et al. | ............... | 156/345.47 |
| 7,619,427 B2 * | 11/2009 | Ando et al. | ............... | 324/750.13 |
| 7,626,407 B2 * | 12/2009 | Kabbani | ................... | 324/750.03 |
| 7,818,085 B1 * | 10/2010 | Chang | ........................ | 700/121 |
| 7,851,237 B2 * | 12/2010 | Walter | ............................ | 438/18 |
| 7,915,081 B2 * | 3/2011 | Tomita et al. | ................. | 438/109 |
| 2002/0050833 A1 * | 5/2002 | Jones et al. | .................... | 324/760 |
| 2002/0158652 A1 * | 10/2002 | Okayasu | ....................... | 324/765 |
| 2003/0001605 A1 * | 1/2003 | Jones et al. | .................... | 324/760 |
| 2005/0270049 A1 * | 12/2005 | Kishishita | ..................... | 324/760 |
| 2006/0114013 A1 * | 6/2006 | Kabbani | ....................... | 324/760 |
| 2006/0273430 A1 * | 12/2006 | Hua et al. | ...................... | 257/621 |
| 2007/0231953 A1 * | 10/2007 | Tomita et al. | ................. | 438/106 |
| 2008/0206908 A1 * | 8/2008 | Walter | ............................ | 438/18 |
| 2011/0042671 A1 * | 2/2011 | Walter | ............................ | 257/48 |

\* cited by examiner

*Primary Examiner* — Jermele M Hollington
(74) *Attorney, Agent, or Firm* — Haynes and Boone, LLP (57) ABSTRACT

The present disclosure provides a semiconductor device, the device includes a substrate, a front-end structure formed in the substrate, a back-end structure formed on the front-end structure, a heater embedded in the back-end structure and operable to generate heat, and a sensor embedded in the back-end structure and operable to sense a temperature of the semiconductor device.

20 Claims, 6 Drawing Sheets

METHOD AND SYSTEM OF TESTING A SEMICONDUCTOR DEVICE

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

An IC typically undergoes a rigorous testing process before it is shipped to an end user. The testing process may include a "burn-in" test or a stress test, wherein the IC is tested under high temperatures. Traditional methods of the high temperature testing have used external heating sources, such as thermal streams or burn-in ovens. These external heating sources are often costly and bulky. In addition, it may be difficult to accurately control the temperature of the IC under test.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
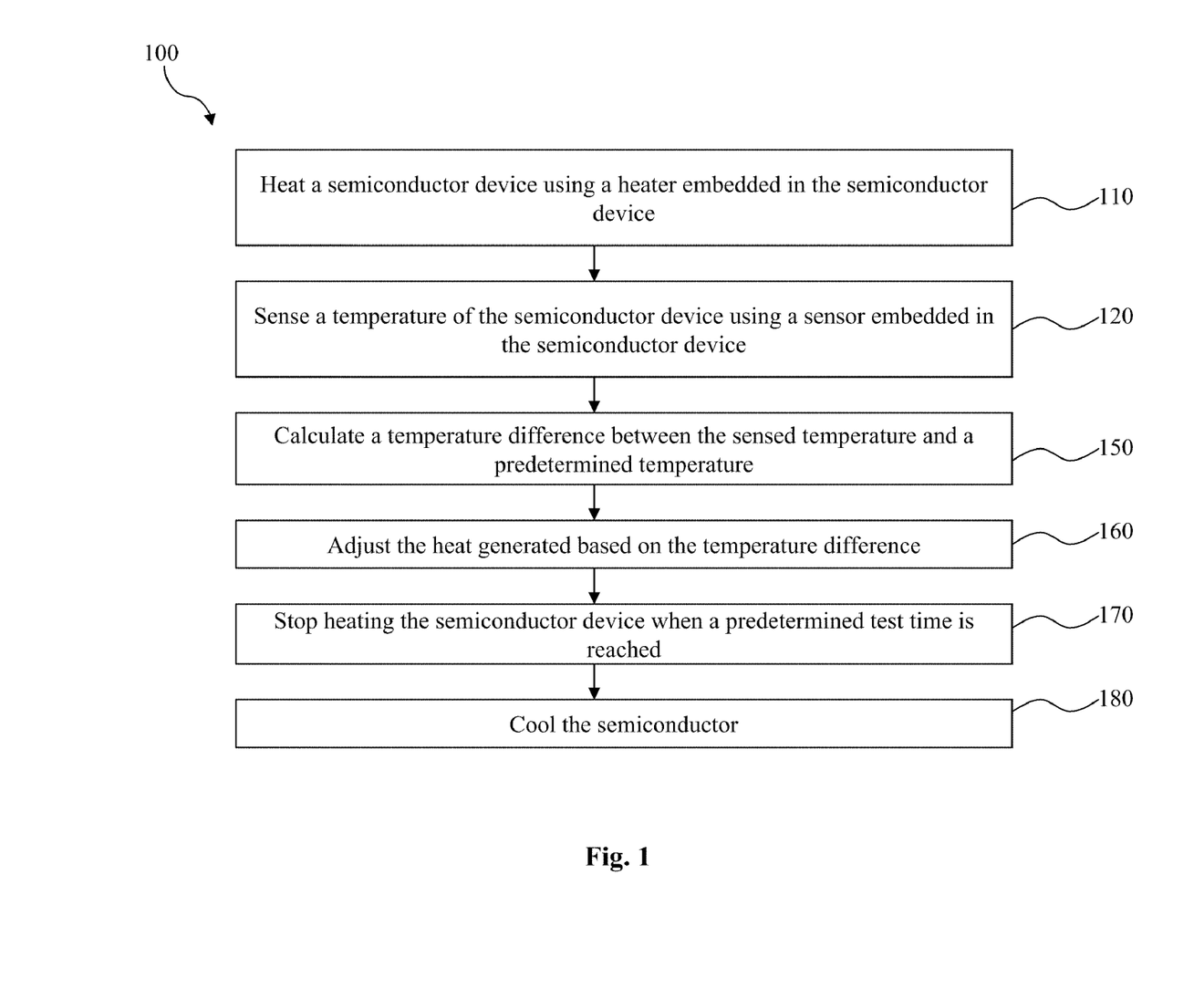
FIG. 1 is a flowchart illustrating a method for testing an IC according to various aspects of the present disclosure.
Figure 2A:
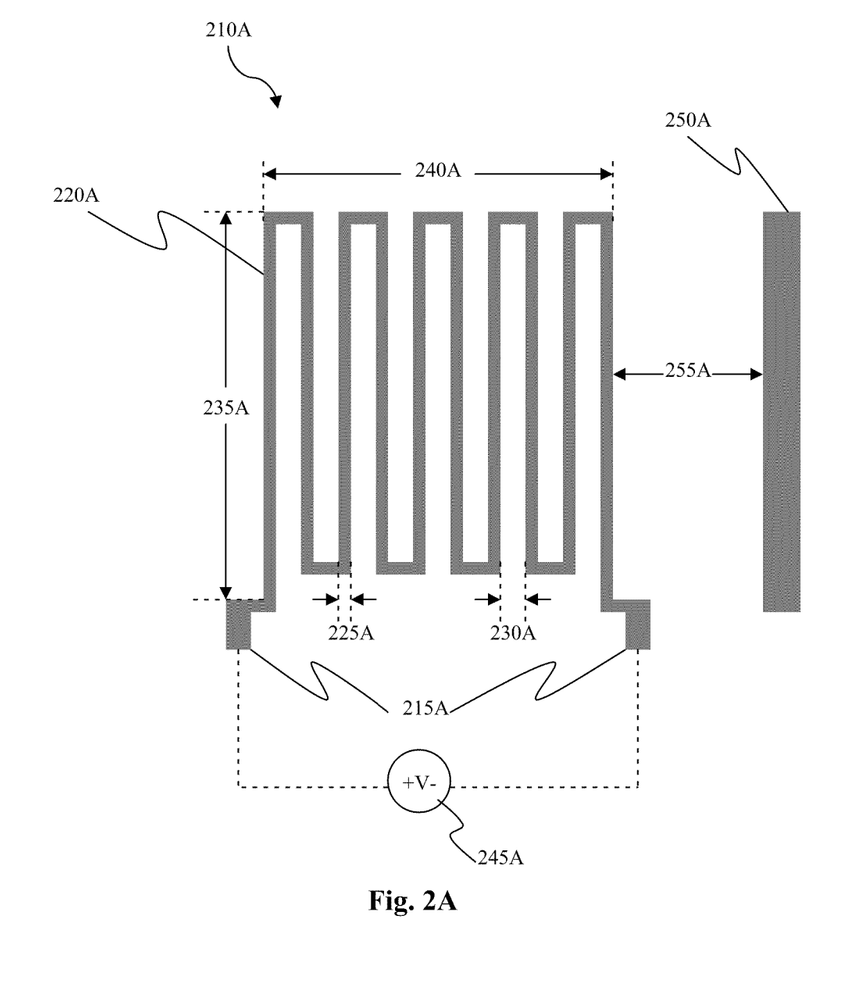
FIGS. 2A-2B are top level views of a heater and a sensor, respectively, for testing an IC according to various aspects of the present disclosure.
Figure 2B:
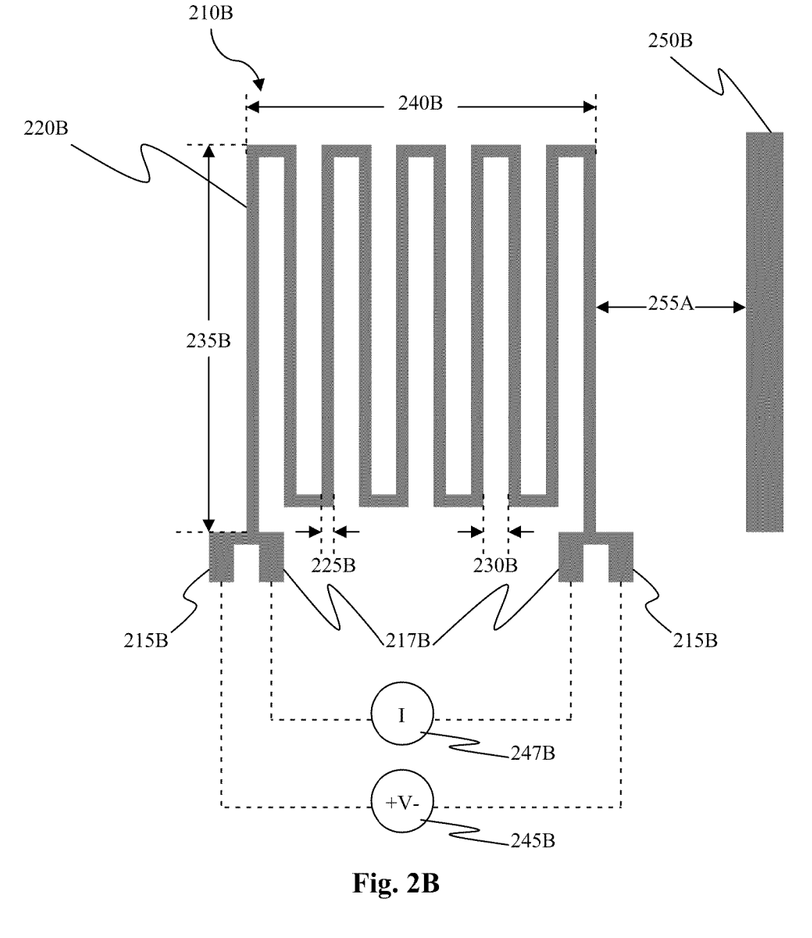
Figure 3:
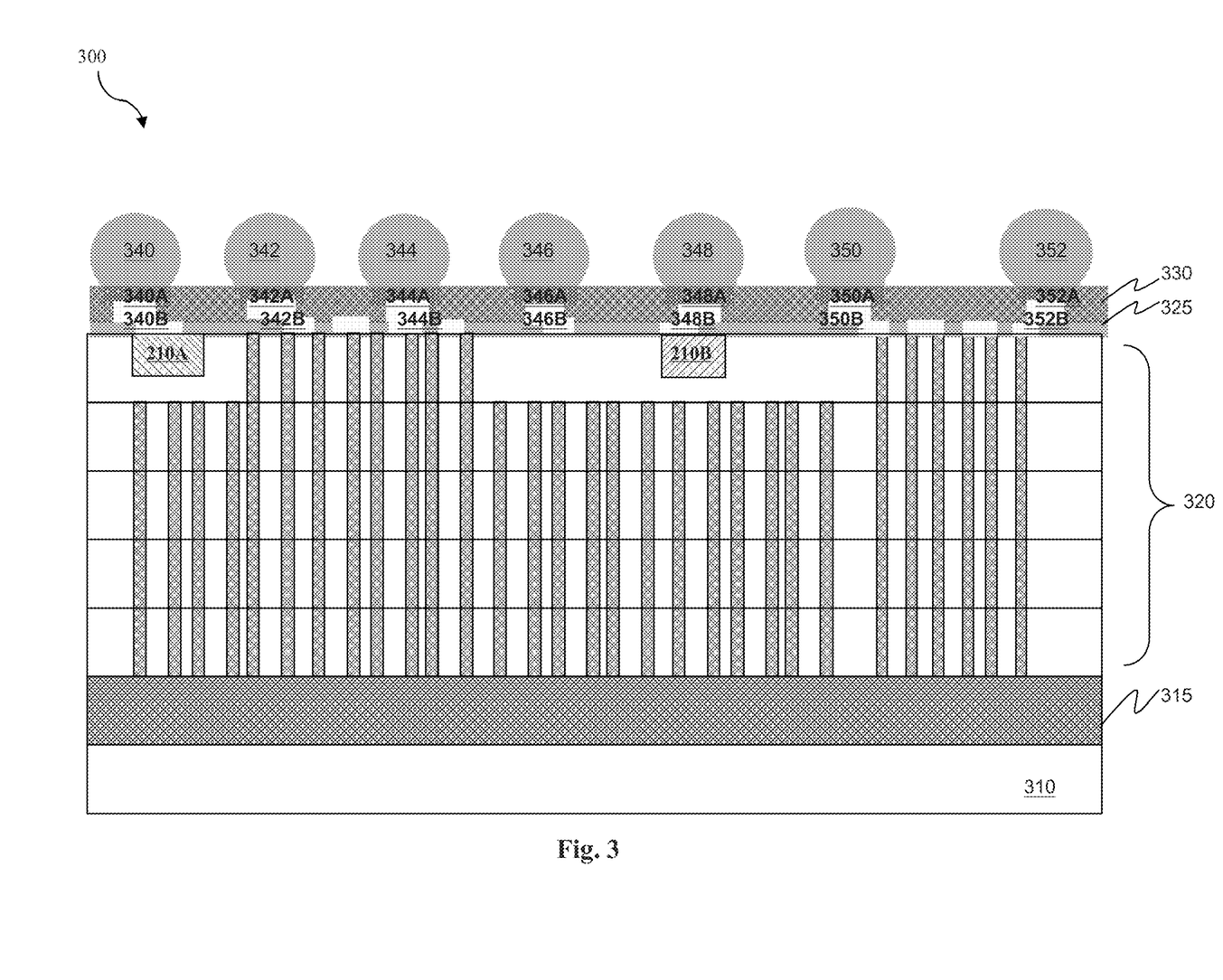
FIGS. 3-4 are cross sectional and top level views, respectively, of a semiconductor device having embedded heaters and sensors for testing an IC according to various aspects of the present disclosure.
Figure 4:
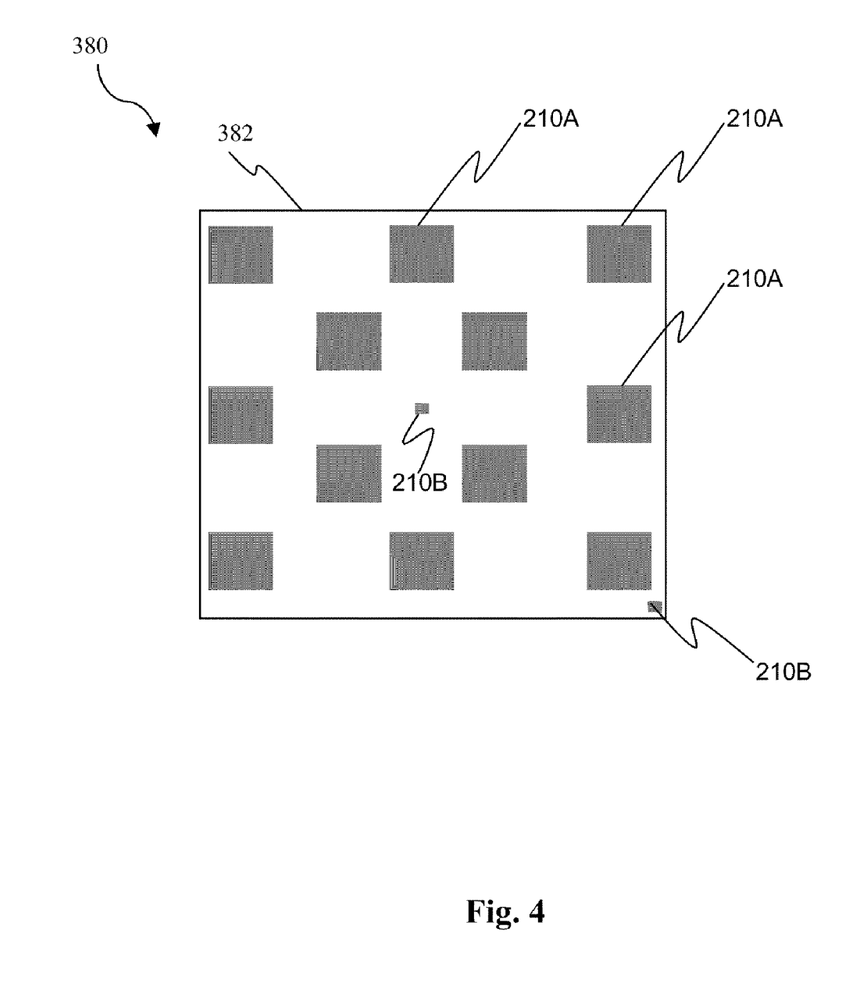
Figure 5:
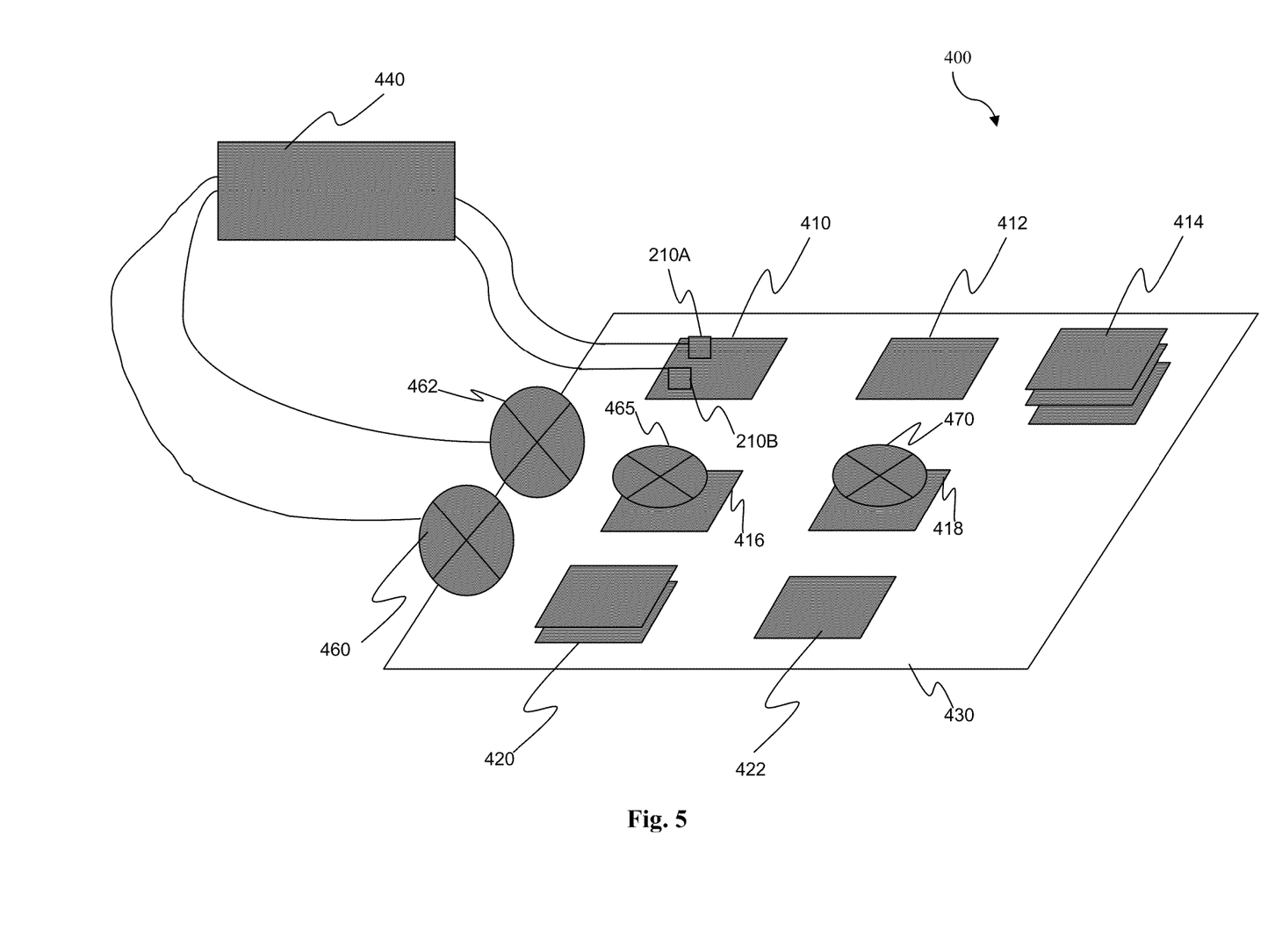
FIG. 5 is a diagrammatic view of a system for testing an IC according to various aspects of the present disclosure.

Illustrate in FIG. 1 is a flowchart of a method 100 for testing an IC chip according to various aspects of the present disclosure. FIGS. 2A-2B illustrate top level views of a heater and a sensor, respectively, for testing the IC chip according to the method 100 of FIG. 1. FIGS. 3-4 are cross sectional and top level views, respectively, of a semiconductor device having embedded heaters and sensors for testing an IC chip according to the method 100 of FIG. 1. FIG. 5 illustrates a diagrammatic view of one embodiment of a system used for testing the IC chip. It should be noted that other apparatuses may be implemented in the test system but are not illustrated for the sake of clarity. It is also understood that additional processes may be provided before, during, and after the method 100 of FIG. 1, and that some other processes may only be briefly described herein.

Referring to FIG. 1, the method 100 begins with block 110 in which a semiconductor device is heated using a heater embedded in a semiconductor device. The method 100 continues with block 120 in which a temperature of the semiconductor device is sensed using a sensor embedded in the semiconductor device. The method 100 continues with block 150 in which a temperature difference between the sensed temperature and a predetermined temperature is calculated. The method 100 continues with block 160 in which the heat generated based on the temperature difference is adjusted. The method 100 continues with block 170 in which heating the semiconductor device is stopped when a predetermined test time is reached. The method 100 ends with block 180 in which the semiconductor is cooled.

Referring now to FIG. 2A, a top level view of a heater 210A is illustrated. A semiconductor fabrication process may include both "front-end" processes (referred to as front end of line (FEOL) processes) and "back-end" processes (referred to as back end of line (BEOL) processes). Front-end processes may include processes performed on a semiconductor wafer up to but not including formation of metal layers. Thus, front-end structures may include various active and passive devices such as transistors, resistors, capacitors, etc. Back-end processes may include processes performed on the semiconductor wafer for interconnecting the various active and passive devices with metal layers and forming electrical connections to external devices. Thus, back-end structures may include contacts, vias, inter-level dielectrics, metal layers, passivation layers, bonding pads, packaging, etc.

In the present embodiment, the heater 210A may be fabricated by a "back-end" semiconductor fabrication process. In the present embodiment, the heater 210A includes terminals 215A coupled to an elongate trace 220A. The trace 220A may include a resistive material operable to generate heat when a voltage is applied to the terminals 215A. In the present embodiment, the resistive material may include a metal, such as Cu, Al, or Ti. The shape, size, thickness, or gap between trace lines of the elongate trace 220A may be varied to control the amount of heat generated. For example, the elongate trace 220A may include a winding rectangular form, a spiral form, a coil form, or even a 3-dimensional form wherein the elongate trace 220A may include several layers stacked on top of one another. In the present embodiment, the elongate trace 220A includes a winding rectangular form and has a trace width 225A of about 10.8 um and a trace gap 230A of about 3 um. Also in the present embodiment, the heater 210A includes an overall length 235A of about 2000 um and an overall width 240A of about 2100 um. Further, the present embodiment includes a spacing 255A between the heater 210A and a nearby circuit 250A to prevent shorting. The spacing 255A may be at least 10 um. The heater 210A may be coupled to a voltage source 245A via the terminals 215A. The voltage source 245A is operable to supply a voltage to the heater 210A to generate heat.

The method 100 continues with block 120 in which a temperature of the semiconductor device is sensed using a sensor embedded in the semiconductor device. Referring to FIG. 2B, a top level view of a sensor 210B is illustrated. The sensor 210B may be fabricated by a "back-end" semiconductor fabrication process. The sensor 210B may include terminals 215B and terminals 217B coupled to an elongate trace 220B. The trace 220B may include a thermal sensitive material wherein a current in the material may be correlated to a temperature of the material. In the present embodiment, the thermal sensitive material may be a material having a low resistance and may include a metal, such as Cu, Al, or Ti. The shape, size, thickness, or gap between trace lines of the elongate trace 220B may be varied. For example, the elongate trace 220B may include a winding rectangular form, a spiral form, a coil form, or even a 3-dimensional form wherein the elongate trace 220B may include several layers stacked on top of one another. In the present embodiment, the elongate trace 220B includes a winding rectangular form and has a trace width 225B of about 1 um and a trace gap 230B of about 1 um. Also in the present embodiment, the sensor 210B includes an overall length 235B of about 150 um and an overall width 240B of about 150 um. Further, the present embodiment includes a spacing 255B between the sensor 210B and a nearby circuit 250B to prevent shorting. The spacing 255B may be at least 10 um.

Still referring to FIG. 2B, the sensor 210B may be coupled to a voltage source 245B via the terminals 215B. The voltage source 245B is operable to supply a voltage to the sensor 210B. The sensor 210B may also be coupled to a current sensor 247B via terminals 217B. The current sensor 247B measures the current generated in the sensor 210B in response to the voltage supplied by the voltage source 245B. Prior to testing, the sensor 210B may be calibrated to define a correlative relationship between current and temperature. For example, under a fixed calibration voltage, an operator (which may be an user or a computer) may measure a calibration current of the sensor 210B by subjecting the sensor to a calibration temperature. Since the sensor includes a thermal sensitive material, different calibration current measurements may be obtained by varying the calibration temperature. The calibration process may be repeated using different calibration voltages for better sampling. The results of calibration are recorded as calibration data and may be stored in memory for later use as discussed below. The calibration data may define a correlative relationship between a measured current and a sensed temperature under a fixed voltage. In the present embodiment, using the voltage source 245B, an operator may supply one or more test voltages to the sensor 210B and measure the corresponding currents. The operator may then extrapolate the temperature of the sensor 210B based on the calibration data. It should be noted that the size of the sensor 210B (150 um×150 um) is smaller than the size of the heater 210A (2100×2000 um) in the present embodiment. Hence, although the sensor 210B may generate some amount of heat by itself, the heat generated may be negligible compared to the heat generated by the heater 210A and will not have a considerable effect on the temperature sensing.

Referring now to FIG. 3, a cross sectional view of a semiconductor device 300 having an embedded heater and an embedded sensor is illustrated. The embedded heater may include a similar configuration as the heater 210A of FIG. 2A, and the embedded sensor may include a similar configuration as the sensor 210B of FIG. 2B. The semiconductor device 300 may include a substrate 310. The semiconductor 300 may also include various active and passive devices 315 formed in the substrate 310. The active and passive devices 315 may include a plurality of doped features. For example, the doped features may include gate stacks and source and drain regions. The active and passive devices 315 may be formed by a front-end semiconductor process and may be referred to as front-end structures. The semiconductor device 300 may also include an interconnect structure 320 formed over the active and passive devices 315. The interconnect structure 320 includes a plurality of metal layers 320A-320E insulated by a dielectric material. The number of metal layers may vary depending on design requirements. In the present embodiment, the heater 210A and sensor 210B may be embedded within the topmost metal layer. In other embodiments, the heater 210A and sensor 210B may be embedded within any of the lower metal layers, or may be embedded within any combination of metal layers. Accordingly, the heater 210A and sensor 210B may be formed in the same process that forms the metal layers without additional processing. Further, the heater 210A and sensor 210B may be positioned such that the semiconductor device 300 may be uniformly heated, and a temperature of the semiconductor device 300 may be accurately sensed for testing purposes as discussed below. For example, the semiconductor device 300 may be divided into a plurality of regions having substantially equal areas, and a heater 210A is placed in each region. Alternatively, the heaters 210A may be spaced equidistant from each other. A sensor 210B may also be placed into each of the divided regions having substantially equal areas of the semiconductor device 300. Alternatively, the sensors 210B may also be placed equidistant from each other. In yet another embodiment, a sensor 210B is placed near a corner portion of the semiconductor device 300, and another sensor 210B is placed near a center portion of the semiconductor device 300. The metal layers may each include metal lines, wherein the metal lines in different metal layers may be interconnected by vias. The metal lines may include Cu, Al, or W, and the dielectric material may include silicon oxide, silicon nitride, or silicon oxynitride.

One or more passivation layers 325, 330 may be formed over the interconnect structure 320. The passivation layers 325, 330 are operable to prevent the underlying layers from exposure to air and may include an oxide or a nitride material. In addition, a plurality of bond pads 340-352 may be coupled to the topmost metal layer including the heater 210A and the sensor 210B via a plurality of aluminum pads 340A-352A and under-bonding metal pads 340B-352B. The bond pads 340-352 may be used to establish electrical connections between the semiconductor device 300 and devices external to the semiconductor device 300. For example, the bond pad 340 may be used to apply a voltage to the heater 210A to generate heat, and the bond pad 348 may be used to apply a voltage to the sensor 210B and sense a resulting current in the sensor 210B, wherein the current may be correlated to a temperature of the semiconductor device 300. The bond pads 342, 344, 346, 350, and 352 may be used to send signals to, and receive signals from, the semiconductor device 300. The bond pads 340-352 may include Cu, Sn, Pb or Ag. The aluminum pads 340A-352A may include Al and may be used for better wire bonding. The under bonding metal pads 340B-352B may include Ti, Cu, or Ni and may be used to reduce diffusion and increase adhesion between the bond pads 340-352 and the aluminum pads 340A-352A. The semiconductor device 300 may also include additional features or layers formed over the passivation layers 325, 330. Although FIG. 3 shows the heater 210A and the sensor 210B being embedded in the topmost metal layer of the interconnect structure 320, the heater 210A and the sensor 210B may be embedded within any layer of the interconnect structure 320 or within layers above the interconnect structure 320. In the semiconductor device 300 shown in FIG. 3, the substrate 310 and the active and passive devices 315 may be considered front-end structures, and everything else in the semiconductor device 300 may be considered back-end structures.

The semiconductor device 300 may refer to one of a plurality of dies 380 on a semiconductor wafer. Referring now to FIG. 4, a top view of an area 382 of the die 380 is illustrated. Multiple heaters 210A and sensors 210B may be embedded in the semiconductor device to ensure sufficient heat generation across the area 382 of the die 380 and accurate temperature sensing of the semiconductor device 300. In the present embodiment, at least 30% of the area 382 of the die 380 is covered with the heaters 210A. Also, at least two sensors 210B are used in the present embodiment, wherein one sensor 210B is embedded near a center portion of the die 380, and another sensor 210B is embedded near a corner portion of the die 380. It is understood that the number of heaters and sensors, and the placement of the heaters and sensors may be varied depending on design and test requirements for a particular application.

Referring now to FIG. 5, a testing system 400 is illustrated with a diagrammatic view. The testing system 400 may include a plurality of semiconductor devices 410-422 coupled to a test board 430. For example, a semiconductor device 410 may be a digital IC device, semiconductor device 412 may be an analog IC device, semiconductor device 414 may be a 3-dimensional system-in-a-package IC device, semiconductor device 420 may be a through-silicon-via (TSV) device, and semiconductor device 422 may be a wafer level chip scale package (WLCSP) device. The test board 430 may be a printed circuit board (PCB) and may include a plurality of conducting layers and insulating layers and electrical circuitries for testing the various semiconductor devices 410-422. One or more heaters 210A and one or more sensors 210B may be embedded in any of the semiconductor devices 410-422, for example 410. The heaters 210A and sensors 210B may be coupled to a controller 440. In the present embodiment, the controller 440 may supply a voltage to the heater 210A to generate heat to the semiconductor device 410. The controller 400 may also supply a voltage to the sensor 210B and may sense a current in the sensor 210B that may be correlated to a temperature of the sensor. The sensed current may then be fed back to the controller 440 and be measured by the controller 440.

The controller 440 may include software applications and hardware operable to perform calculations. Based on the measured current and the voltage applied to the sensor 210B, the controller 440 may be operable to extrapolate the temperature of the sensor 210B using the calibration data of the sensor 210B that was stored in memory as discussed above. Since the sensor 210B is embedded within the semiconductor device 410, the temperature of the sensor 210B may be indicative of a temperature of the semiconductor device 410. Hence, the controller 440 may be operable to detect the temperature of the semiconductor device 410. Further, the controller 440 may determine an average temperature when two or more sensors 210B are used. Additionally, the controller 440 may supply different voltages to the sensor 210B for a more accurate temperature determination of the semiconductor device 410.

The method 100 continues with block 150 in which a temperature difference between the sensed temperature and a predetermined temperature is calculated. Still referring to FIG. 5, the operator may input a predetermined temperature into the controller 440. The predetermined temperature may be a desired temperature level under which the stress or burn-in testing on the semiconductor device 410 should be performed. After extrapolating the temperature of the semiconductor device 410, the controller 440 compares the sensed temperature of the semiconductor device 410 with the desired temperature and calculates a temperature difference. The temperature difference indicates whether the desired temperature level for testing has been achieved.

The method 100 continues with block 160 in which the heat generated is adjusted based on the temperature difference. Still referring to FIG. 5, the controller 440 may adjust the voltage applied to the heater 210A based on the temperature difference calculated. If the temperature difference indicates that the temperature of the semiconductor device 410 has not reached (less than) the desired temperature level, the controller 440 may supply a greater voltage level to the heater 210A so that the heater 210A may generate more heat. If the temperature of the semiconductor device 410 has reached (equal to or greater than) the desired temperature level, the controller 440 may supply a smaller voltage level to the heater 210A so that the heater 210A may generate less heat. Further, the controller 440 may independently adjust the voltage to heaters 210A located at different regions of the semiconductor device 400 when two or more heaters are used so that the semiconductor device 400 may be uniformly heated. A software program may be used to operate the controller 440. Hence, the testing system 400 employs a programmable feedback to fine tune the testing temperature for the semiconductor device 410.

The method 100 continues with block 170 in which the heating is stopped when a predetermined testing time is reached. Still referring to FIG. 5, the operator may input a predetermined testing time into the controller 440. The predetermined test time may be a desired amount of time for which a cycle of the stress or burn-in testing for the semiconductor device 410 should be conducted. The controller 440 may include an internal clock operable to measure time elapsed. When the temperature of the semiconductor device 410 has reached the desired temperature for stress or burn-in testing, the clock may be set and starts to measure the time elapsed. When the time elapsed has reached the predetermined testing time, the controller 440 may shut off the voltage to the heater 210A so that heat is no longer generated.

The method 100 continues with block 180 in which the semiconductor is cooled. Still referring to FIG. 5, the testing system 400 may include one or more cooling devices 460-470. The cooling devices 460-470 may include fans or heat sinks. The cooling devices 460-470 may also be coupled to the test board 430 or be coupled directly to the semiconductor devices 410-422. For example, the cooling devices 460 and 462 may be coupled to the test board 430, and the cooling devices 465 and 470 are coupled directly to the semiconductors 416 and 418, respectively. The cooling devices 460-470 may be coupled to the controller 440, wherein the controller 440 may be operable to adjust the speed at which the cooling devices 460-470 cool the semiconductors 410-422.

It is understood that the method 100 may continue with additional steps to complete the testing of the semiconductor device 300. For example, blocks 110-180 may constitute one cycle of testing. Depending on the testing requirements, additional cycles of testing may be performed by repeating blocks 110-180.

In summary, the methods and devices disclosed herein provide an effective and efficient approach to test a semiconductor device. The methods and devices disclosed herein take advantage of embedding a heater and a sensor in a back-end structure of the semiconductor device, wherein the heater generates heat to heat up the semiconductor device for stress and burn-in testing, and the sensor senses the temperature of the semiconductor device and provides feedback to an external controller. In doing so, the present embodiments offer several advantages over prior art devices. One advantage of the present embodiments is that it does not require external heating devices for the stress and burn-in testing. As stated before, external heating devices like thermal streams and burn-in ovens may be costly and bulky. In comparison, the current embodiment offers smaller heating devices that are less expensive. Another advantage of the present embodiments is that by embedding the heater and the sensor in a semiconductor device under test, it may be easier to detect and control a precise temperature of the semiconductor device under test. Yet another advantage of the present embodiments is that it allows for an easily programmable feedback system in which the testing temperature may be constantly adjusted. Still another advantage of the present embodiments is that the embedded heater and sensor are fabricated by a back-end semiconductor fabrication process, which is easy to implement and requires no extra process steps.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for testing a semiconductor device, comprising:
   providing the semiconductor device having a die that includes a front-end structure formed using a front-end semiconductor process and a back-end structure formed over the front-end structure using a back-end semiconductor process;
   heating the semiconductor device using a heater embedded in the die and in the back-end structure; and
   sensing a temperature of the semiconductor device using a sensor, wherein sensing the temperature includes:
      supplying a second voltage to the sensor;
      measuring a current of the sensor corresponding to the second voltage; and
      extrapolating the temperature correlating to the measured current.

2. The method of claim 1, wherein the sensor is embedded in the back-end structure.

3. The method of claim 1, wherein the heater includes a resistive material operable to generate heat responsive to a voltage supplied to the heater, and wherein the sensor includes a thermal sensitive material operable to sense the temperature of the semiconductor device.

4. The method of claim 3, wherein heating the semiconductor device includes supplying a first voltage to the heater.

5. The method of claim 1, wherein the heater and the sensor are each formed of a material that includes at least one of Cu, Al, or Ti.

6. The method of claim 1, further including:
   calculating a difference between the extrapolated temperature and a predetermined temperature; and
   adjusting a first voltage to the heater based on the difference.

7. The method of claim 1, further including:
   cutting off a first voltage to the heater when a predetermined testing time is reached; and
   cooling the semiconductor device.

8. A semiconductor device, comprising:
   a substrate;
   a front-end structure formed in the substrate;
   a back-end structure formed over the front-end structure and electrically coupled to the front-end structure, wherein the back-end structure is part of a die associated with a wafer;
   a heater embedded in the back-end structure and operable to generate heat; and
   a sensor embedded in the back-end structure and operable to sense a temperature of the semiconductor device,
   wherein the heater and the sensor are each formed of a material that includes at least one of Cu, Al, or Ti.

9. The semiconductor device of claim 8, wherein the heater includes a resistive material operable to generate heat responsive to a voltage supplied to the heater.

10. The semiconductor device of claim 9, wherein the sensor includes a thermal sensitive material operable to sense the temperature of the semiconductor device.

11. The semiconductor device of claim 10, wherein the resistive material and the thermal sensitive material each includes Cu, Al, or Ti.

12. The semiconductor device of claim 8, further including a plurality of heaters embedded in the back-end structure, wherein the heaters cover at least 30% of an area of the semiconductor device.

13. The semiconductor device of claim 8, further including a plurality of sensors embedded in the back-end structure, wherein at least one of the sensors is disposed at a center portion of the semiconductor device, and at least another one of the sensors is disposed at a corner portion of the semiconductor device.

14. The semiconductor device of claim 8, wherein the sensor occupies a smaller region of the semiconductor device than the heater.

15. The semiconductor device of claim 14, wherein the heater includes an overall length of about 2000 um and an overall width of about 2100 um, and wherein the sensor includes an overall length of about 150 um and an overall width of about 150 um.

16. A system, comprising:
   a semiconductor device having a substrate including a semiconductor material and an interconnect structure, the interconnect structure electrically coupled to the semiconductor material;
   a heater disposed within the interconnect structure and operable to generate heat;
   a sensor disposed within the interconnect structure and operable to sense a temperature of the semiconductor device; and
   a controller coupled to the heater and the sensor, wherein the controller is operable to monitor and adjust the temperature of the semiconductor device, wherein the controller is operable to:

measure the current:
extrapolate the temperature of the semiconductor device correlating, to the measured current, and
wherein the semiconductor device includes a die and the heater is embedded in the die.

17. The system of claim 16, wherein the interconnect structure includes a plurality of metal layers, wherein the heater and the sensor are disposed within the topmost metal layer.

18. The system of claim 16, wherein the heater is operable to generate heat in response to a first voltage supplied by the controller, and wherein the sensor is operable to output a current in response to a second voltage supplied by the controller.

19. The system of claim 18, wherein the controller is further operable to:
calculate a difference between the extrapolated temperature and a predetermined temperature; and
adjust the first voltage based on the difference.

20. The system of claim 18, further comprising a cooling device coupled to the semiconductor device and operable to cool the semiconductor device.

* * * * *